(12) United States Patent
Wang

(10) Patent No.: US 8,685,795 B2
(45) Date of Patent: Apr. 1, 2014

(54) FLANK WETTABLE SEMICONDUCTOR DEVICE

(75) Inventor: Jinquan Wang, Tianjin (CN)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/462,827

(22) Filed: May 3, 2012

(65) Prior Publication Data

US 2012/0292755 A1    Nov. 22, 2012

(30) Foreign Application Priority Data

May 18, 2011    (CN) .......................... 2011 1 0162405

(51) Int. Cl.
*H01L 23/495* (2006.01)

(52) U.S. Cl.
USPC ............ 438/114; 438/106; 438/110; 438/113

(58) Field of Classification Search
USPC ........................................................ 438/114
See application file for complete search history.

(56) References Cited

U.S. PATENT DOCUMENTS

| | | | |
|---|---|---|---|
| 6,238,952 B1 | 5/2001 | Lin | |
| 6,261,864 B1 | 7/2001 | Jung et al. | |
| 6,306,685 B1 | 10/2001 | Liu et al. | |
| 6,333,252 B1 | 12/2001 | Jung et al. | |
| 6,342,730 B1 | 1/2002 | Jung et al. | |
| 6,495,909 B2 | 12/2002 | Jung et al. | |
| 6,528,893 B2 | 3/2003 | Jung et al. | |
| 6,608,366 B1 | 8/2003 | Fogelson et al. | |
| 6,700,188 B2 | 3/2004 | Lin | |
| 6,861,295 B2 | 3/2005 | Jung et al. | |
| 7,023,074 B2 | 4/2006 | Li et al. | |
| 7,033,866 B2 | 4/2006 | Chow et al. | |
| 7,105,383 B2 | 9/2006 | Vo et al. | |
| 7,348,269 B2 | 3/2008 | Tanaka et al. | |
| 7,382,045 B2 | 6/2008 | Osako et al. | |
| 7,397,112 B2 | 7/2008 | Sato et al. | |
| 7,402,459 B2 | 7/2008 | Xiaochun et al. | |
| 7,405,104 B2 | 7/2008 | Minamio et al. | |
| 7,405,106 B2 | 7/2008 | Maloney et al. | |
| 7,405,945 B2 | 7/2008 | Miura | |
| 7,413,934 B2 | 8/2008 | Tellkamp | |
| 7,423,337 B1 | 9/2008 | Patwardhan et al. | |
| 7,456,049 B2 | 11/2008 | Miyata | |
| 7,458,054 B2 | 11/2008 | Hara | |
| 7,462,870 B2 | 12/2008 | Nakashima | |
| 2005/0029638 A1 | 2/2005 | Ahn | |
| 2005/0116321 A1* | 6/2005 | Li et al. .......................... | 257/666 |

(Continued)

FOREIGN PATENT DOCUMENTS

| | | |
|---|---|---|
| JP | 2000-294719 | 10/2000 |
| JP | 2007-214185 | 8/2007 |
| WO | 2009/125250 A1 | 10/2009 |

*Primary Examiner* — Colleen Matthews
*Assistant Examiner* — William Harriston
(74) *Attorney, Agent, or Firm* — Charles Bergere

(57) ABSTRACT

A flank wettable semiconductor device is assembled from a lead frame or substrate panel by at least partially undercutting the lead frame or substrate panel with a first cutting tool to expose a flank of the lead frame and applying a coating of tin or tin alloy to the exposed flank prior to singulating the lead frame or substrate panel into individual semiconductor devices. The method includes electrically interconnecting lead frame flanks associated with adjacent semiconductor devices before applying the coating of tin or tin alloy. The lead frame flanks may be electrically interconnected during wire bonding.

7 Claims, 2 Drawing Sheets

(56) References Cited

U.S. PATENT DOCUMENTS

| | | |
|---|---|---|
| 2007/0126092 A1 | 6/2007 | San Antonio |
| 2008/0268578 A1* | 10/2008 | Shimanuki et al. ............ 438/124 |
| 2011/0244629 A1* | 10/2011 | Gong et al. ................... 438/112 |
| 2012/0032352 A1 | 2/2012 | Huening |

* cited by examiner

FLANK WETTABLE SEMICONDUCTOR DEVICE

BACKGROUND OF THE INVENTION

The present invention relates to semiconductor packaging and more particularly to a semiconductor device having solder wettable side-walls or 'flanks' to facilitate inspection of solder joints when the semiconductor device is mounted on a substrate or circuit board using a surface-mount technology (SMT) process.

Due to the manner in which semiconductor devices such as QFN (Quad Flat No lead) packages are singulated with a saw blade the surface of the exposed lead frame flank is flush with the molding compound such that solder does not readily climb-up or "wick" the flank or side-walls of the package meaning that the QFN package is not flank wettable.

FIG. 1 is a flow chart of a conventional assembly process for assembling a QFN device. The conventional process includes a wafer mount and saw step 10 followed by a die bond step 11 in which a die is bonded to a flag of a lead frame, and wire a bond step 12 in which the die is electrically connected to the leads of the lead frame. The lead frame typically is formed of copper and may be plated with another metal such as palladium (PPF) or silver (Ag). In the wire bond step die bond pads are connected to lead frame pads with bond wires. The bond wires may be gold, copper, aluminum or the like. This assembly is then encapsulated with a molding compound in step 13 followed by a laser marking and de-tape step 14. If a silver plated lead frame is used a further plating of tin or tin alloy (Sn) is applied in step 15. Finally, individual QFN devices are formed with a saw singulation step 16. The singulated QFN devices are then visually inspected and packed for shipment.

FIG. 2 is a partial cross-sectional view of a conventional QFN device assembled with a copper lead frame such as via the method described above. The QFN device is non-wettable at its flank due to the untreated copper surface 20 that is exposed yet flush with the side walls of the QFN device.

In view of the foregoing it would be desirable to have a QFN device that is solder wettable at its side walls or flanks to facilitate inspection of solder joints when the package is mounted such as to a printed circuit board (PCB) using an SMT process.

BRIEF DESCRIPTION OF THE DRAWINGS

The following detailed description of a preferred embodiment of the invention will be better understood when read in conjunction with the appended drawings. The present invention is illustrated by way of example and is not limited by the accompanying figures in which like references indicate similar elements. It is to be understood that the drawings are not to scale and have been simplified for ease of understanding the invention.

DETAILED DESCRIPTION OF THE INVENTION

According to the present invention there is provided a process for producing a flank wettable semiconductor device including: providing a lead frame or substrate panel, at least partially undercutting the lead frame or substrate panel with a first cutting tool to expose a flank of said lead frame, and applying a coating of tin or tin alloy to said exposed flank prior to singulating the lead frame or substrate panel into individual semiconductor devices.

The process may include electrically interconnecting lead frame flanks associated with adjacent semiconductor devices before applying the coating of tin or alloy. The lead frame flanks may be electrically interconnected by a wire bonding step.

The process may include saw singulating the substrate panel into individual semiconductor devices, wherein the saw singulating step includes cutting the substrate panel with a second cutting tool to separate the panel into the individual semiconductor devices. The second cutting tool preferably is narrower than the first cutting tool. The tin coating may be performed by electro-plating or electro-deposition.

The present invention also provides a saw QFN semiconductor device assembled by a method as described above.

Figure 1:
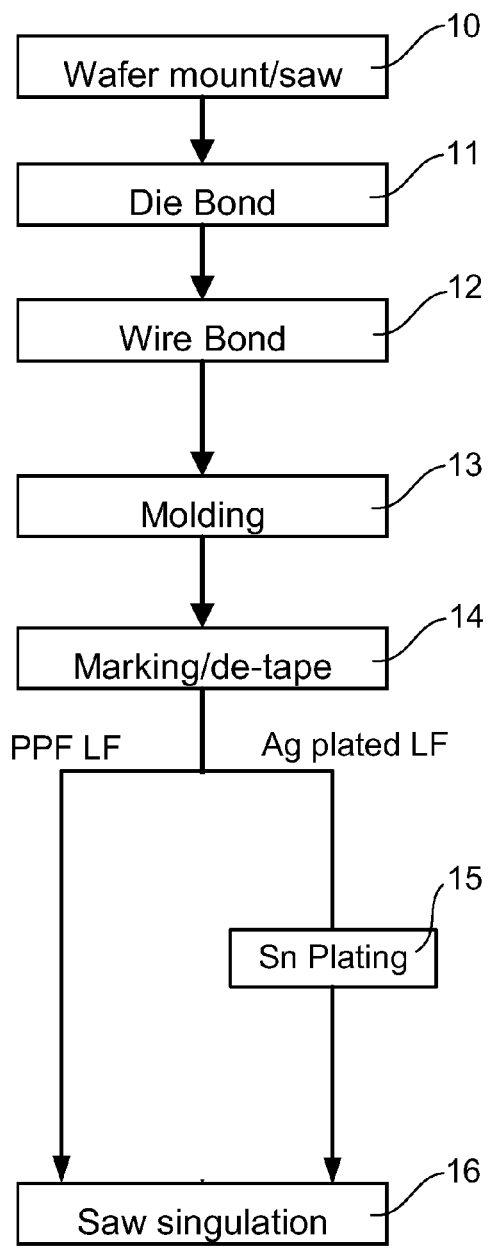
FIG. 1 is a flow chart of a conventional process for assembling a QFN semiconductor device.
Figure 3:
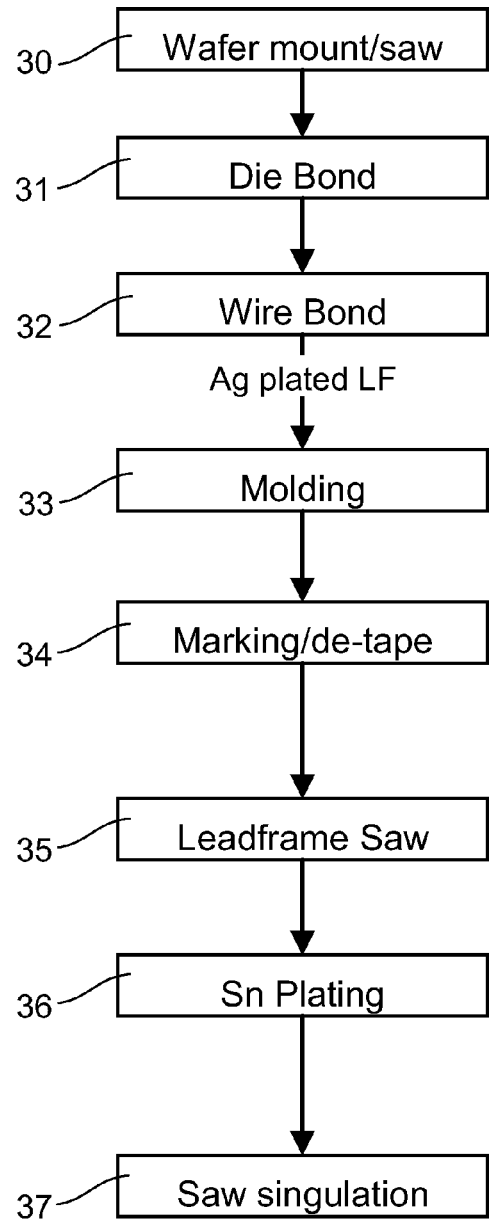
FIG. 3 is a flow chart of a process for assembling a QFN semiconductor device according to the present invention.
Figure 2:
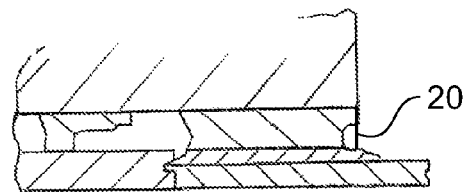
FIG. 2 is an enlarged partial cross-sectional view of a conventional QFN device produced by the process of FIG. 1.

Referring now to FIG. 3, a process for assembling a QFN semiconductor device according to the present invention includes a wafer mount and saw step 30 followed by a die bond step 31. Steps 30, 31 are comparable to steps 10, 11 of the conventional process described with reference to FIG. 1 and thus are well known to those of skill in the art.

Step 31 is followed by a wire bond step 32 which differs from the conventional wire-bond step 12 in that as well as connecting die bond pads to leads of the lead frame, it also electrically interconnects with connecting wires lead frame leads between adjacent QFN devices.

Figure 4:
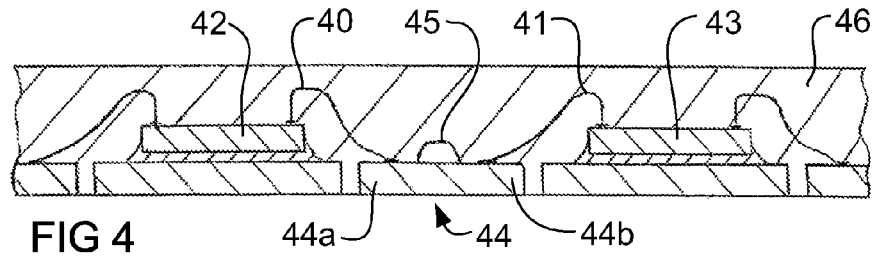
FIGS. 4-7 show enlarged cross-sectional views of a QFN device being assembled by the process of FIG. 3.

The wire bond step 32 is illustrated in FIG. 4, which shows connecting wires 40, 41 connecting die bond pads on adjacent dies 42, 43 to leads 44a and 44b of lead frame 44. FIG. 4 also shows additional connecting wire 45 that electrically interconnects leads 44a and 44b. Leads 44a and 44b will form leads of adjacent QFN devices following saw singulation step 37, described below, which separates the lead frame panel into individual semiconductor devices. The purpose of the additional connecting wire 45 is to maintain leads 44a, 44b at a similar electrical potential during a tin plating step 36.

Wire bond step 32 is followed by an encapsulation or molding step 33 in which the lead frame and die assembly is covered with a mold compound 46, as is known in the art. After the molding step 33, a laser marking and de-tape step 34 are performed. Steps 33 and 34 are comparable to steps 13, 14 of the conventional process described with reference to FIG. 1.

Figure 5:
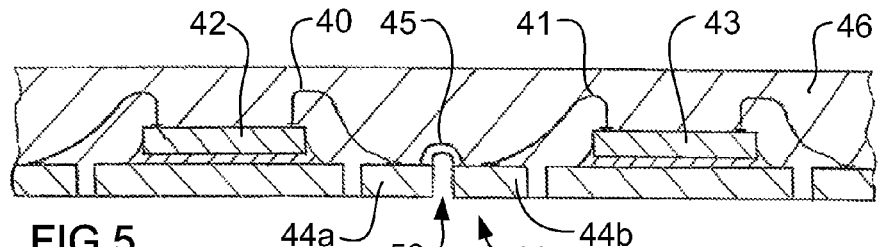

Step 34 is followed by a first saw step 35 during which material (e.g. copper) of the lead frame below the additional wire 45 is sawn away. The connecting wire 45 and molding compound 46 are not separated so that the semiconductor panel is rigid enough for handling. Saw step 35 is a first step of a two step sawing process that leads to singulation of the panel into individual semiconductor devices. Saw step 35 is performed by a first cutting tool that partially undercuts the semiconductor panel to form a partial undercut 50 as shown in FIG. 5. The partial undercut 50 substantially separates lead frame 44 into leads or lead fingers 44a, 44b that will form leads of adjacent QFN devices. While undercut 50 separates lead frame 44 to form the two leads 44a, 44b it does not sever the connecting wire 45, which is used to ensure that the leads 44a, 44b remain electrically interconnected during a later tin plating step 36 described below.

Figure 6:
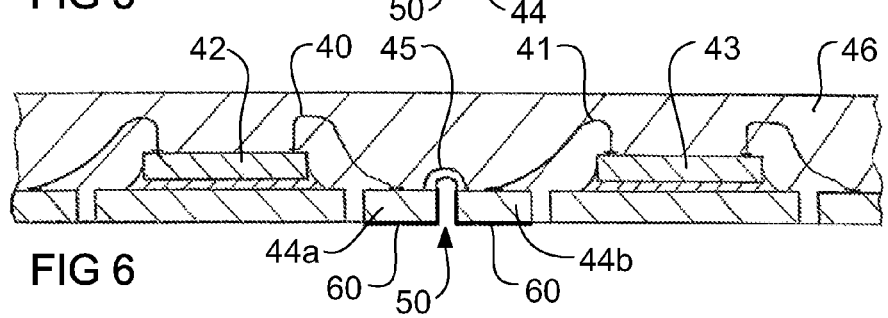

FIG. 6 shows tin plating step 36 being performed by an electro-plating or electro-deposition process during which the lead frame 44 (e.g. copper) including the ends or edges of leads 44a, 44b that are exposed by undercut 50 are coated with a layer 60 of tin (Sn) or tin alloy such as tin/lead alloy for non-green devices. Leads 44a, 44b are connected to a source of electrical potential such that they will form a cathode during the electro-plating or electro-deposition process. The electro-plating or electro-deposition process results in layer 60 of tin or tin alloy being deposited onto the exposed surfaces (e.g. copper) of the lead frame 44. The layer 60 of tin/tin alloy imparts solderability or solder wetability during a soldering process such as SMT as well as protecting the exposed surfaces of the lead frame 44 from corrosion. The lead frame 44 is typically preplated with silver at the bond surface (back side is bare copper) since it is usually not economical to preplate with palladium and then plate with tin or tin alloy.

Figure 7:
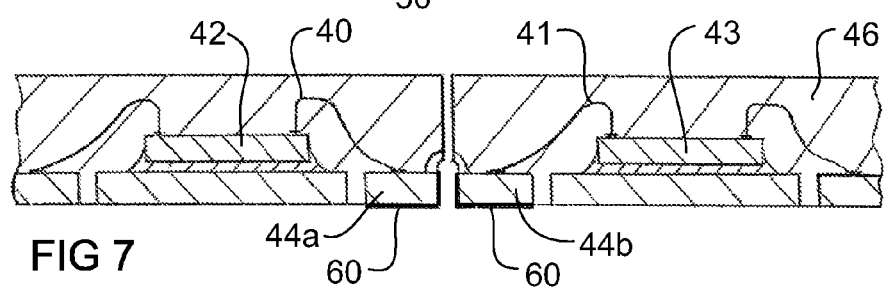

Following the tin plating step 36 the semiconductor panel is singulated in step 37 into individual semiconductor devices such as with a saw (see also FIG. 7). In one embodiment of the invention, the singulation step 37 is performed using a second cutting tool (e.g., a saw blade) that is narrower than the first cutting tool used to make the partial undercut 50. The reason for the narrower cutting tool is to avoid disturbing the tin coating 60 or re-exposing the material (e.g. copper) of the leads 44a, 44b. The second cutting tool needs to be accurately aligned or positioned to avoid disturbing the coating 60 that is applied during tin plating step 36. The tin plating step 36 can also be performed chemically but electro-plating or electro-deposition is preferred as it is currently more economical. The singulated QFN devices are then inspected and packed for shipment.

Figure 8:
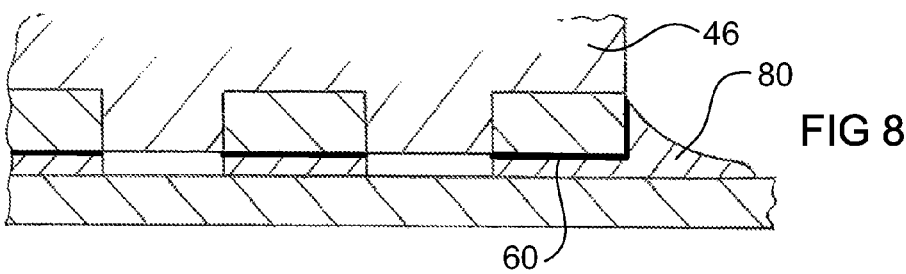
FIG. 8 shows an enlarged cross-sectional view of a QFN device assembled by the process of FIG. 3.

FIG. 8 shows a QFN device produced by the process of the present invention being mounted to a printed circuit board using an SMT process with solder joint 80 over tin coating 60 being clearly visible, which facilitates inspection. That is, because of the first cut and plating processes of steps 35 and 36, during soldering, the solder will readily flow onto the exposed sides of the leads 44a, 44b and thus after SMT, the solder connections can easily be checked by visual inspection.

As is evident from the foregoing discussion, the present invention provides a method of producing a flank wettable semiconductor device. While the preferred embodiments of the invention have been illustrated and described, it will be clear that the invention is not limited to these embodiments only. Numerous modifications, changes, variations, substitutions and equivalents will be apparent to those skilled in the art without departing from the spirit and scope of the invention as defined in the claims.

The invention claimed is:

1. A method of assembling a flank wettable semiconductor device, comprising:
   providing a lead frame or substrate panel, the lead frame or substrate panel including a plurality of die attach flags, and wherein each of the flags has a plurality of associated electrical contact pads;
   attaching semiconductor dies to the die attach flags;
   electrically connecting bonding pads on the semiconductor dies with respective ones of the associated electrical contact pads of the flag upon which the die is attached with first bond wires;
   electrically connecting the electrical contact pads of adjacent devices with a plurality of additional bond wires;
   at least partially undercutting the lead frame or substrate panel with a first cutting tool to expose flanks of the electrical contact pads of the lead frame or substrate panel;
   applying a coating of tin or tin alloy to said exposed flank; and
   singulating the lead frame or substrate panel into individual semiconductor devices after applying said coating, wherein said singulating includes cutting the additional bond wires so that the electrical contact pads of adjacent devices are no longer electrically connected to each other.

2. The method of claim 1, wherein said singulating includes cutting the lead frame or substrate panel with a second cutting tool to separate the lead frame or substrate panel into said individual semiconductor devices.

3. The method of claim 2, wherein said second cutting tool is narrower than said first cutting tool.

4. The method of claim 1, wherein said tin coating is performed by electro-plating or electro-deposition.

5. A QFN semiconductor device assembled by the method of to claim 1.

6. A flank wettable QFN semiconductor device, comprising:
   a lead frame including a plurality of leads;
   a semiconductor die surrounded by the plurality of leads, wherein the leads are electrically connected to die bonding pads of the die with first bond wires;
   additional bond wires attached to the plurality of leads, wherein the additional bond wires electrically connect the plurality of leads to respective leads of an adjacent device prior to the semiconductor device being separated from said adjacent device;
   a mold compound that encapsulates the die, leads and first bond wires, wherein ends of the leads are exposed along side walls of the device;
   a coating of tin or tin alloy on the exposed portions of the leads, wherein said coating is applied to the exposed portions of the leads prior to said device being separated from an adjacent device during assembly.

7. The flank wettable semiconductor device of claim 6, wherein said coating is applied to the exposed portions of the leads by electro-plating or electro-deposition.

* * * * *